US012598962B2

(12) United States Patent
Theil et al.

(10) Patent No.: US 12,598,962 B2
(45) Date of Patent: Apr. 7, 2026

(54) SYSTEM AND METHOD FOR BONDING TRANSPARENT CONDUCTOR SUBSTRATES

(71) Applicant: ADEIA SEMICONDUCTOR BONDING TECHNOLOGIES INC., San Jose, CA (US)

(72) Inventors: Jeremy Alfred Theil, Mountain View, CA (US); Cyprian Emeka Uzoh, San Jose, CA (US); Gaius Gillman Fountain, Jr., Youngsville, NC (US); Belgacem Haba, Saratoga, CA (US); Rajesh Katkar, Milpitas, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 465 days.

(21) Appl. No.: 18/183,768

(22) Filed: Mar. 14, 2023

(65) Prior Publication Data

US 2024/0312951 A1    Sep. 19, 2024

(51) Int. Cl.
H01L 23/48        (2006.01)
H01L 21/027        (2006.01)
            (Continued)

(52) U.S. Cl.
CPC .......... H01L 24/80 (2013.01); H01L 21/0273 (2013.01); H01L 21/561 (2013.01);
            (Continued)

(58) Field of Classification Search
CPC ... H01L 24/80; H01L 21/0273; H01L 21/561;

H01L 23/12; H01L 24/03; H01L 24/08; H01L 24/96; H01L 25/162; H01L 25/167; H01L 2224/0345; H01L 2224/03452; H01L 2224/03831; H01L 2224/03845;
            (Continued)

(56) References Cited

U.S. PATENT DOCUMENTS

| | | |
|---|---|---|
| 5,753,536 A | 5/1998 | Sugiyama et al. |
| 5,771,555 A | 6/1998 | Eda et al. |
|  | (Continued) | |

FOREIGN PATENT DOCUMENTS

| | | |
|---|---|---|
| CN | 112730560 A | 4/2021 |
| CN | 114308161 A | 4/2022 |
|  | (Continued) | |

OTHER PUBLICATIONS

Aleksandrova et al., Electrical Characterization of PEDOT: PSS Anodes by Impedance Measurements. IJTPE Journal-Microelectron Int'l. Jan. 4, 2016;33(1): 47-52.
            (Continued)

*Primary Examiner* — Niki H Nguyen
(74) *Attorney, Agent, or Firm* — Knobbe, Martens, Olson & Bear, LLP

(57)        ABSTRACT

An element includes a substrate and a surface layer on the substrate. The surface layer includes at least one first region comprising an optically transparent and electrically insulative first material and at least one second region at least partially embedded in the at least one first region. The at least one second region comprises an optically transparent and electrically conductive second material.

17 Claims, 7 Drawing Sheets

(51) Int. Cl.

| | |
|---|---|
| *H01L 21/56* | (2006.01) |
| *H01L 23/00* | (2006.01) |
| *H01L 23/12* | (2006.01) |
| *H01L 23/52* | (2006.01) |
| *H01L 25/16* | (2023.01) |
| *H01L 29/40* | (2006.01) |

(52) U.S. Cl.

CPC .............. *H01L 23/12* (2013.01); *H01L 24/03* (2013.01); *H01L 24/08* (2013.01); *H01L 24/96* (2013.01); *H01L 25/162* (2013.01); *H01L 25/167* (2013.01); *H01L 2224/0345* (2013.01); *H01L 2224/03452* (2013.01); *H01L 2224/03831* (2013.01); *H01L 2224/03845* (2013.01); *H01L 2224/08145* (2013.01); *H01L 2224/80011* (2013.01); *H01L 2224/80895* (2013.01); *H01L 2224/80896* (2013.01); *H01L 2224/80948* (2013.01); *H01L 2224/96* (2013.01); *H01L 2924/12041* (2013.01); *H01L 2924/12042* (2013.01); *H01L 2924/12043* (2013.01)

(58) Field of Classification Search

CPC . H01L 2224/08145; H01L 2224/80011; H01L 2224/80895; H01L 2224/80896; H01L 2224/96; H01L 2924/12041; H01L 2924/12043; H01L 25/0657; H01L 2225/06541; H01L 24/05; H01L 2224/80357; H01L 25/0652; H01L 24/06; H01L 2224/32145; H01L 2224/80001; H01L 24/09; H01L 2224/32225; H01L 24/73; H01L 2224/16227; H01L 2224/73204; H01L 25/0655; H01L 24/81; H01L 2224/0401; H01L 2224/12105; H01L 2224/06181; H01L 2224/16145; H01L 2224/16225; H01L 2224/08147; H01L 2224/80894; H01L 21/2007; H01L 21/76224; H01L 2224/04042; H01L 23/53295; H01L 2224/08235; H01L 2224/06051; H01L 2224/0807; H01L 2224/05576; H01L 2224/08123; H01L 25/0753; H01L 2224/08237; H01L 2224/48145; H01L 2224/16238; H01L 2224/4847

See application file for complete search history.

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,387,944 | B2 | 6/2008 | Tong et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,486,758 | B2 | 7/2013 | Oganesian et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,709,913 | B2 | 4/2014 | Oganesian et al. |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,945,303 | B2 | 2/2015 | Wakamatsu et al. |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 * | 4/2016 | Chen ..................... H01L 24/93 |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,564,414 | B2 | 2/2017 | Enquist et al. |
| 9,620,481 | B2 | 4/2017 | Edelstein et al. |
| 9,656,852 | B2 | 5/2017 | Cheng et al. |
| 9,716,033 | B2 | 7/2017 | Enquist et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,829,699 | B1 | 11/2017 | Sakai et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,434,749 | B2 | 10/2019 | Tong |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,852,545 | B2 | 12/2020 | Mohammed et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,910,272 | B1 | 2/2021 | Zhou et al. |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |

(56) References Cited

U.S. PATENT DOCUMENTS

| | | | |
|---|---|---|---|
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,573 | B2 | 10/2021 | Uzoh et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,244,920 | B2 | 2/2022 | Uzoh |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,296,053 | B2 | 4/2022 | Uzoh et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |
| 11,355,443 | B2 | 6/2022 | Huang et al. |
| 11,367,652 | B2 | 6/2022 | Uzoh et al. |
| 11,373,963 | B2 | 6/2022 | DeLaCruz et al. |
| 11,380,597 | B2 | 7/2022 | Katkar et al. |
| 11,385,278 | B2 | 7/2022 | DeLaCruz et al. |
| 11,387,202 | B2 | 7/2022 | Haba et al. |
| 11,387,214 | B2 | 7/2022 | Wang et al. |
| 11,393,779 | B2 | 7/2022 | Gao et al. |
| 11,428,942 | B2 | 8/2022 | Russell |
| 11,462,419 | B2 | 10/2022 | Haba |
| 11,476,213 | B2 | 10/2022 | Haba et al. |
| 11,515,291 | B2 | 11/2022 | DeLaCruz et al. |
| 11,626,363 | B2 | 4/2023 | Haba et al. |
| 11,631,647 | B2 | 4/2023 | Haba |
| 2004/0033424 | A1 | 2/2004 | Talin et al. |
| 2004/0084414 | A1 | 5/2004 | Sakai et al. |
| 2006/0057945 | A1 | 3/2006 | Hsu et al. |
| 2006/0272942 | A1 | 12/2006 | Sirringhaus |
| 2007/0111386 | A1 | 5/2007 | Kim et al. |
| 2008/0230389 | A1 | 9/2008 | Ha et al. |
| 2010/0055673 | A1 | 3/2010 | Agarwal et al. |
| 2011/0229991 | A1 | 9/2011 | Wang et al. |
| 2014/0044900 | A1 | 2/2014 | Sparks et al. |
| 2014/0087552 | A1 | 3/2014 | Di Palma et al. |
| 2014/0175655 | A1 | 6/2014 | Chen et al. |
| 2014/0199719 | A1 | 7/2014 | Shih et al. |
| 2014/0264291 | A1 | 9/2014 | Zhang et al. |
| 2014/0311904 | A1 | 10/2014 | Rozlosnik et al. |
| 2015/0064498 | A1 | 3/2015 | Tong |
| 2016/0064672 | A1 | 3/2016 | Lee et al. |
| 2016/0343682 | A1 | 11/2016 | Kawasaki |
| 2018/0073977 | A1 | 3/2018 | Wang et al. |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190583 | A1 | 7/2018 | DeLaCruz et al. |
| 2018/0219038 | A1 | 8/2018 | Gambino et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2018/0331329 | A1 | 11/2018 | Andry et al. |
| 2019/0019968 | A1 | 1/2019 | He et al. |
| 2019/0097088 | A1 | 3/2019 | Huppmann et al. |
| 2019/0115277 | A1 | 4/2019 | Yu et al. |
| 2019/0115323 | A1 | 4/2019 | Haba et al. |
| 2019/0131277 | A1 | 5/2019 | Yang et al. |
| 2019/0385935 | A1 | 12/2019 | Gao et al. |
| 2020/0013765 | A1 | 1/2020 | Fountain, Jr. et al. |
| 2020/0035641 | A1 | 1/2020 | Fountain, Jr. et al. |
| 2020/0282424 | A1 | 9/2020 | Oralkan et al. |
| 2020/0294908 | A1 | 9/2020 | Haba et al. |
| 2020/0328162 | A1 | 10/2020 | Haba et al. |
| 2020/0395321 | A1 | 12/2020 | Katkar et al. |
| 2020/0406255 | A1 | 12/2020 | Florentino et al. |
| 2021/0035934 | A1 | 2/2021 | Katz et al. |
| 2021/0098412 | A1 | 4/2021 | Haba et al. |
| 2021/0118864 | A1 | 4/2021 | DeLaCruz et al. |
| 2021/0143125 | A1 | 5/2021 | DeLaCruz et al. |
| 2021/0181510 | A1 | 6/2021 | Katkar et al. |
| 2021/0193603 | A1 | 6/2021 | DeLaCruz et al. |
| 2021/0193624 | A1 | 6/2021 | DeLaCruz et al. |
| 2021/0193625 | A1 | 6/2021 | Katkar et al. |
| 2021/0205813 | A1 | 7/2021 | Iwai et al. |
| 2021/0213448 | A1 | 7/2021 | Allen et al. |
| 2021/0217646 | A1 | 7/2021 | Liu et al. |
| 2021/0242152 | A1 | 8/2021 | Fountain, Jr. et al. |
| 2021/0296282 | A1 | 9/2021 | Gao et al. |
| 2021/0305202 | A1 | 9/2021 | Uzoh et al. |
| 2021/0366820 | A1 | 11/2021 | Uzoh |
| 2021/0367117 | A1 | 11/2021 | Xie et al. |
| 2022/0077063 | A1 | 3/2022 | Haba |
| 2022/0077087 | A1 | 3/2022 | Haba |
| 2022/0091146 | A1 | 3/2022 | Huff et al. |
| 2022/0139867 | A1 | 5/2022 | Uzoh |
| 2022/0139869 | A1 | 5/2022 | Gao et al. |
| 2022/0208650 | A1 | 6/2022 | Gao et al. |
| 2022/0208702 | A1 | 6/2022 | Uzoh |
| 2022/0208723 | A1 | 6/2022 | Katkar et al. |
| 2022/0216167 | A1* | 7/2022 | Yang .................... H01L 24/80 |
| 2022/0246497 | A1 | 8/2022 | Fountain, Jr. et al. |
| 2022/0285303 | A1 | 9/2022 | Mirkarimi et al. |
| 2022/0319901 | A1 | 10/2022 | Suwito et al. |
| 2022/0320035 | A1 | 10/2022 | Uzoh et al. |
| 2022/0320036 | A1 | 10/2022 | Gao et al. |
| 2023/0005850 | A1 | 1/2023 | Fountain, Jr. |
| 2023/0005876 | A1 | 1/2023 | Hu |
| 2023/0019869 | A1 | 1/2023 | Mirkarimi et al. |
| 2023/0036441 | A1 | 2/2023 | Haba et al. |
| 2023/0067677 | A1 | 3/2023 | Lee et al. |
| 2023/0069183 | A1 | 3/2023 | Haba |
| 2023/0100032 | A1 | 3/2023 | Haba et al. |
| 2023/0115122 | A1 | 4/2023 | Uzoh et al. |
| 2023/0122531 | A1 | 4/2023 | Uzoh |
| 2023/0123423 | A1 | 4/2023 | Gao et al. |
| 2023/0125395 | A1 | 4/2023 | Gao et al. |
| 2023/0130259 | A1 | 4/2023 | Haba et al. |
| 2023/0132632 | A1 | 5/2023 | Katkar et al. |
| 2023/0140107 | A1 | 5/2023 | Uzoh et al. |
| 2023/0142680 | A1 | 5/2023 | Guevara et al. |
| 2023/0154816 | A1 | 5/2023 | Haba et al. |
| 2023/0154828 | A1 | 5/2023 | Haba et al. |
| 2023/0158500 | A1 | 5/2023 | Deng et al. |
| 2023/0187264 | A1 | 6/2023 | Uzoh et al. |
| 2023/0187317 | A1 | 6/2023 | Uzoh |
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |
| 2023/0299029 | A1 | 9/2023 | Theil et al. |
| 2023/0343734 | A1 | 10/2023 | Uzoh et al. |
| 2023/0360950 | A1 | 11/2023 | Gao |
| 2023/0361074 | A1 | 11/2023 | Uzoh et al. |
| 2023/0369136 | A1 | 11/2023 | Uzoh et al. |
| 2023/0375613 | A1 | 11/2023 | Haba et al. |
| 2024/0038702 | A1 | 2/2024 | Uzoh |
| 2024/0055407 | A1 | 2/2024 | Workman |
| 2024/0063199 | A1 | 2/2024 | Tao et al. |
| 2024/0076725 | A1 | 3/2024 | Liu et al. |
| 2024/0079376 | A1 | 3/2024 | Suwito et al. |
| 2024/0105674 | A1 | 3/2024 | Uzoh et al. |

(56) References Cited

U.S. PATENT DOCUMENTS

| | | | |
|---|---|---|---|
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |
| 2024/0266255 A1 | 8/2024 | Haba et al. | |
| 2024/0298454 A1 | 9/2024 | Haba | |
| 2024/0304593 A1 | 9/2024 | Uzoh | |
| 2024/0312951 A1 | 9/2024 | Theil et al. | |
| 2024/0332184 A1 | 10/2024 | Katkar et al. | |
| 2024/0332227 A1 | 10/2024 | Uzoh et al. | |
| 2024/0332231 A1 | 10/2024 | Uzoh | |
| 2024/0332267 A1 | 10/2024 | Haba et al. | |
| 2024/0387419 A1 | 11/2024 | Mrozek et al. | |
| 2025/0004197 A1 | 1/2025 | Haba et al. | |
| 2025/0006632 A1 | 1/2025 | Chang et al. | |
| 2025/0006642 A1 | 1/2025 | Haba et al. | |
| 2025/0006674 A1 | 1/2025 | Uzoh et al. | |
| 2025/0006679 A1 | 1/2025 | Theil et al. | |
| 2025/0006689 A1 | 1/2025 | Uzoh et al. | |
| 2025/0054854 A1 | 2/2025 | Katkar et al. | |
| 2025/0079364 A1 | 3/2025 | Uzoh et al. | |
| 2025/0096191 A1 | 3/2025 | Gao et al. | |
| 2025/0112123 A1 | 4/2025 | Katkar et al. | |
| 2025/0185163 A1 | 6/2025 | Zhao et al. | |
| 2025/0210585 A1 | 6/2025 | Fountain, Jr. et al. | |
| 2025/0212554 A1 | 6/2025 | Katkar et al. | |
| 2025/0218903 A1 | 7/2025 | Uzoh et al. | |
| 2025/0273517 A1 | 8/2025 | Lee et al. | |

FOREIGN PATENT DOCUMENTS

| | | | |
|---|---|---|---|
| CN | 117065817 A | 11/2023 | |
| EP | 2124039 A1 | 11/2009 | |
| JP | 2013-033786 A | 2/2013 | |
| JP | 2018-160519 | 10/2018 | |
| KR | 10-0945800 B1 | 3/2010 | |
| KR | 1682915 B1 | 12/2016 | |
| KR | 10-2019-0058345 A | 5/2019 | |
| KR | 10-2023-0159381 A | 11/2023 | |
| WO | WO 2005/043584 A2 | 5/2005 | |
| WO | WO 2011/002957 A2 | 1/2011 | |
| WO | WO 2023/122513 A1 | 6/2023 | |

OTHER PUBLICATIONS

Benaglia et al., "In Operando Nanomechanical Mapping of PEDOT: PSS Thin Films in Electrolyte Solutions with Bimodal AFM". Nanoscale. 2022;14(38): 14146-14154.

Bhujel et al., "Bandgap Engineering of PEDOT:PSS/rGO a Hole Transport Layer for SiNWs Hybrid Solar Cells". Bull Mater Sci. Jun. 2021;44 (72); 11 pages.

Carter et al., Enhanced Adhesion of PEDOT: PSS to Substrates Using Polydopamine as a Primer. Polymer J. Feb. 2024;56(2): 115-120.

Eom et al., "Highly Conductive Polydopamine Coatings by Direct Electrochemical Synthesis on Au". ACS Appl Polymer Mater. Jul. 19, 2022;4(8): 5319-5329.

Iqbal et al., "Recent developments in hybrid conducting polymers: Synthesis, applications and future prospects," J Indust Eng Chem. Apr. 25, 2018;60: 53-84.

Koschinski et al., Validation of Transparent and Flexible Neural Implants for Simultaneous Electrophysiology, Functional Imaging, and Optogenetics. J Mater Chem B. 2023;11(40): 9639-9357.

Kumar et al., "Achieving Low Contact Resistivity in PEDOT: PSS/n-Si Solar Cells". Phys Scr. (2023) 035005; 9 pages; https://doi.org/10.1088/1402-4896/acb515.

Lang et al., "Microscopical Investigations of PEDOT: PSS Thin Films". Adv Function Mater. Apr. 23, 2009;19(8): 1215-1220.

Lin et al., "A hybrid bonding interconnection with a novel low-temperature bonding polymer system,"2022 IEEE 72nd Electronic Components and Technology Conference [ECTC]; May 3, 20221, pp. 2128-2134.

Lövenich W., "PEDOT—Properties and Applications". Polymer Science Series Co, Sep. 2014:56(1): 135-153.

Moulé et al., "Mixed interlayers at the interface between PEDOT: PSS and conjugated polymers provide charge transport control". J Mater Chem C. 2015;3(11): 2664-2676.

Music et al., "Tuneable Thermal Expansion of Poly (3,4-ethylenedioxythiophene) Polystyrene Sulfonate". J Phys Condens Matter (2019) 125101; 8 pages https://doi.org/10.1088/1361-648X/aafdda.

Ng et al., Polymer Electrolyte System Based on Carrageenan-Poly (3, 4-ethylenedioxythiophene)(PEDOT) Composite for Dye Sensitized Solar Cell. In IOP Conference Series: Materials Science and Engineering Apr. 1, 2015 (vol. 79, No. 1, p. 012020). IOP Publishing.

ONSEMI AR0820 image, cross section of a CMOS image sensor product. The part in the image was shipped on Sep. 16, 2021. Applicant makes No. representation that the part in the image isidentical to the part identified in the separately submitted reference BUSH, Nov. 8, 2018, Electronics Weekly.com ("BUSH article"); however, the imaged part and the part shown in the BUSH article share the part number "ONSEMI AR0820."

Qu et al., Strength and Adhesion Characterization of Electrochemically Deposited Conjugated Polymer Films. Acta Biomater. Feb. 1, 2016;31: 114-121.

Tran et al., "Recent Developments and Implementations of Conductive Polymer-based Flexible Devices in Sensing Applications". Polymers. Sep. 7, 2022;14(18): 3730; 29 pages.

Vizza et al., "Electrodeposition of Cu on PEDOT for a hybrid solid-state electronic device". Surfaces. May 24, 2021;4(2): 157-168.

Wang et al., "Layered Microporous Polymers by Solvent Knitting Method". Sci Adv. Mar. 31, 2017;3(3): e1602610, 9 pages.

Worfolk et al., Ultrahigh Electrical Conductivity in Solution-Sheared Polymeric Transparent Films. PNAS. Nov. 17, 2015;112(46): 14138-14143.

Zhong et al., Chemical Mechanical Polishing of Polymeric Materials for MEMS Applications. Microelectron J. Apr. 1, 2006;37(4): 295-301.

International Search Report and Written Opinion dated Jul. 2, 2024, issued in Application No. PCT/US2024/019052; 14 pages.

Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/(published Nov. 8, 2018; downloaded Jul. 26, 2023).

Heitmann, Ulrike, "Development of ZnO-based transparent conductive adhesive for the application in III-V/silicon tandem solar cells," Dissertation zur Erlangung des Doktorgrades der Technischen Fakultät der Albert-Ludwigs-Universität Freiburg im Breisgau, 2021, 207 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

SONY IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

(56)                    References Cited

OTHER PUBLICATIONS

Choi, G.W. et al., "CMP characteristics and optical property of ITO thin film by using silica slurry with a variety of process parameters," Microelectronic Engineering, 2006, vol. 83, pp. 2213-2217.

Huang, C. et al., "Effect of OH- on chemical mechanical polishing of β-Ga2O3 (100) substrate using an alkaline slurry," RSC Advances, 2018, vol. 8, p. 6544, doi: 10.1039/c7ra11570.

Hönle, M. et al., "Mechanism of indium tin oxide // indium tin oxide direct wafer bonding," Thin Solid Films, 2020, vol. 704, https://doi.org/10/1016/j.tsr.2020/137964, 7 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Liu, Z.J. et al., "Monolithic LED microdisplay on active matrix substrate using flip-chip technology," IEEE Journal of Selected Topics in Quantum Electronics, 2009, 5 pages, doi.org/10.1109/JSTQE.2009.2015675.

Massoubre, D. et al., "Fabrication of planar GaN-based micro-pixel light emitting diode arrays," 2009 IEEE Leos Annual Meeting Conf. Proc., 2009, pp. 84-85.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Aleshin et al., Metallic conductivity at low temperatures in poly (3, 4-ethylenedioxythiophene) doped with PF 6. Physical Review B. Aug. 15, 1997;56(7):3659-3663.

Chen Y., "Low-temperature processing of poly (3, 4-ethylenedioxythiophene): poly (styrenesulfonate) Hydrogels for Biomedical Applications". Master Thesis; University of California, Los Angeles; 2020; 116 pages.

Glover et al., A Scanning Kelvin probe investigation of the interaction of PEDOT: PSS films with metal surfaces and potential corrosion protection properties. J Electrochem Soc. Aug. 12, 2015;162(10):H799 in 9 pages.

Li et al., "Study of conductive polymer PEDOT: PSS for infrared thermal detection". Optical Mater Express. Nov. 1, 2019;9(11): 4474-4482.

Nagamatsu et al., A 12% efficient silicon/PEDOT: PSS heterojunction solar cell fabricated at< 100 C. IEEE J Photovolt. Nov. 20, 2013;4(1): 260-264.

Ong et al., "A brief review of nanoparticles-doped PEDOT: PSS nanocomposite for OLED and OPV". Nanotech Rev. May 6, 2022;11(1): 1870-1889.

Pattanayak et al., "Microfluidic Chips: Recent Advances, Critical Strategies in Design, Applications and Future Perspectives". Microfluidics & Nanofluidics. Dec. 2021;25: 1-28.

Sakar et al., Microfluidic Platform to Study Electric Field Based Root Targeting by Pathogenic Zoospores. In 2022 IEEE 35th International Conference on Micro Electro Mechanical Systems Conference (MEMS) Jan. 9, 2022 (pp. 884-887).

Stepien et al., Thermal operating window for PEDOT: PSS films and its related thermoelectric properties. Synthetic Metals. Mar. 1, 2017;225: 49-54.

Wu et al., "Construction of Microfluidic Chips Using Polydimethylsiloxane for Adhesive Bonding". Lab on a Chip. 2005;5(12): 1393-1398.

* cited by examiner

FIG. 5C:                          FIG. 5D:
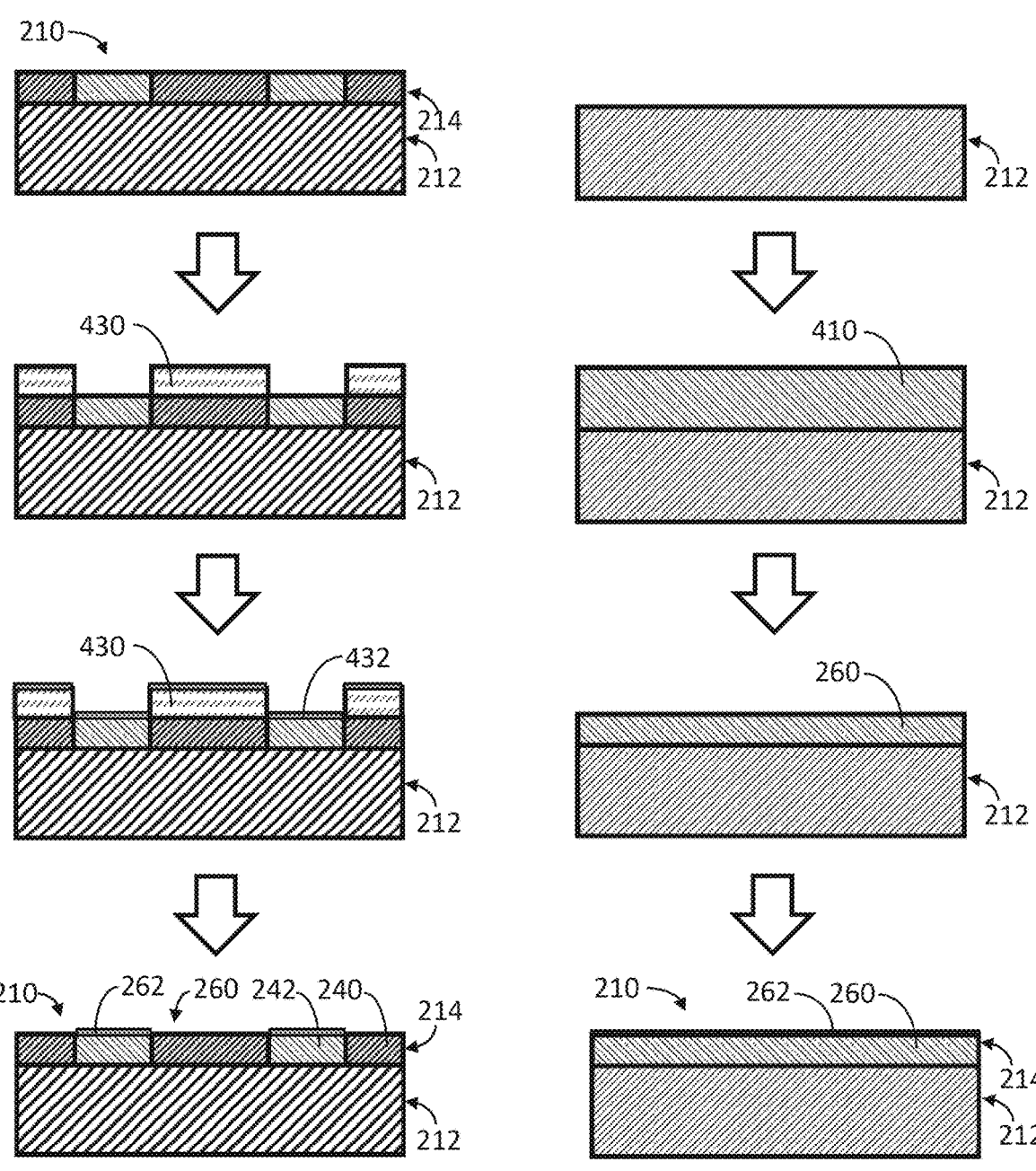

SYSTEM AND METHOD FOR BONDING TRANSPARENT CONDUCTOR SUBSTRATES

BACKGROUND

Field

The field relates to systems and methods for wafer-to-wafer, die-to-die, and/or die-to-wafer hybrid bonding for semiconductor devices and electrooptical devices.

Description of the Related Art

Semiconductor elements, such as semiconductor wafers or integrated device dies, can be stacked and directly bonded to one another without an adhesive, thereby forming a bonded structure. Nonconductive (e.g., dielectric; semiconductor) surfaces can be made extremely smooth and treated to enhance direct, covalent bonding, even at room temperature and without application of pressure beyond contact. In some hybrid direct bonded structures, nonconductive field regions of the elements can be directly bonded to one another, and corresponding conductive contact structures can be directly bonded to one another.

For example, a semiconductor element can be mounted to a carrier, such as a package substrate, an interposer, a reconstituted wafer or element, etc. A semiconductor element can be stacked on top of the semiconductor element (e.g., a first integrated device die can be stacked on a second integrated device die). Each of the semiconductor elements can have conductive pads for mechanically and electrically bonding the semiconductor elements to one another with the conductive pads mechanically and electrically bonded to one another.

SUMMARY

Certain implementations described herein provide an element comprising a substrate and a surface layer on the substrate. The surface layer comprises at least one first region comprising an optically transparent and electrically insulative first material and at least one second region at least partially embedded in the at least one first region. The at least one second region comprises an optically transparent and electrically conductive second material.

Certain implementations described herein provide a method comprising providing a first element comprising an optically transparent first substrate and an optically transparent first surface layer comprising one or more electrically insulative first regions and one or more electrically conductive second regions. The method further comprises providing a second element comprising a second substrate and a second surface layer comprising one or more electrically insulative third regions and one or more electrically conductive fourth regions. The method further comprises directly bonding the first and second surface layers with one another without an adhesive, said directly bonding comprising contacting the first and second regions with one another.

Certain implementations described herein provide an apparatus comprising a first substrate, a first layer on the first substrate, a second substrate, and a second layer on the second substrate. The first layer comprises at least one first region comprising an optically transparent and electrically insulative first material and at least one second region at least partially embedded in the at least one first region. The at least one second region comprises an optically transparent and electrically conductive second material. The second layer is directly bonded to the first layer and comprises at least one third region comprising an electrically insulative third material and at least one fourth region at least partially embedded in the at least one third region. The at least one fourth region comprises an electrically conductive fourth material.

Certain implementations described herein provide an element comprising a substrate and a hybrid bonding surface layer on the substrate. The hybrid bonding surface layer comprises at least one first layer comprising an optically transparent and electrically conductive first material and at least one second layer over the at least one first layer. The at least one second layer comprises an optically transparent and electrically conductive metal or polysilicon material.

Certain implementations described herein provide an apparatus comprising a first substrate, a first plurality of layers on the first substrate, a second substrate, and a second plurality of layers on the second substrate. The first plurality of layers comprises at least one first layer comprising an optically transparent and electrically conductive first material and at least one second layer over the at least one first layer. The at least one second layer comprises an optically transparent and electrically conductive second material comprising metal or polysilicon. The second plurality of layers comprises at least one third layer comprising an optically transparent and electrically conductive third material and at least one fourth layer over the at least one third layer. The at least one fourth layer comprises an optically transparent and electrically conductive fourth material comprising metal or polysilicon and is directly bonded to the second material.

Certain implementations described herein provide a structure comprising a first device assembly comprising a first backplane substrate comprising optically transparent first layer regions and a first device substrate. The first device substrate comprises first optical devices, optically transparent second layer regions in electrical communication with the first optical devices, and optically transparent third layer regions in electrical communication with the first optical devices. The third layer regions are at an opposite side of the first device substrate from the second layer regions. The second layer regions are directly bonded to the first layer regions.

BRIEF DESCRIPTION OF THE DRAWINGS

Specific implementations will now be described with reference to the following drawings, which are provided by way of example, and not limitation.

FIGS. 5A-5D schematically illustrate cross-sectional views of example fabrication sequences for providing the first element in accordance with certain implementations described herein.

DETAILED DESCRIPTION

Figure 1A:
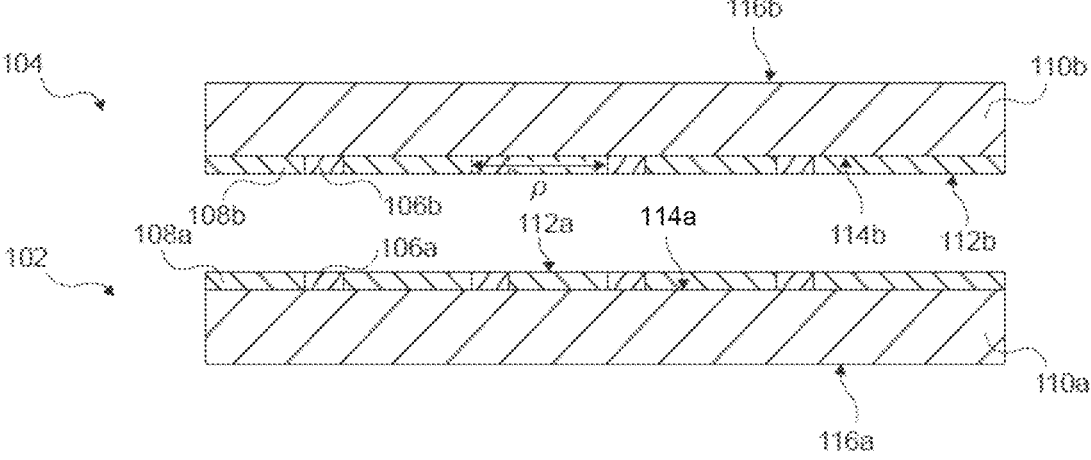
FIG. 1A is a schematic cross-sectional side view of two elements prior to bonding in accordance with certain implementations described herein.
Figure 1B:
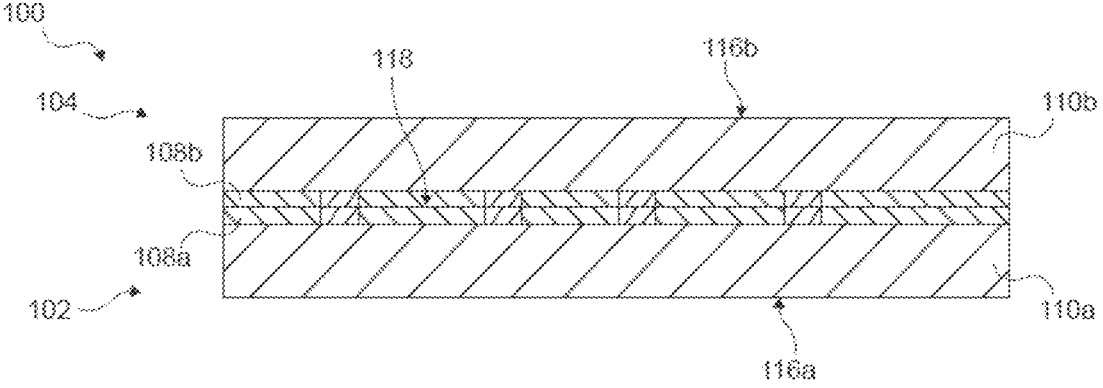
FIG. 1B is a schematic cross-sectional side view of the two elements of FIG. 1A after bonding in accordance with certain implementations described herein.

Various implementations disclosed herein relate to directly bonded structures in which two or more elements can be directly bonded to one another without an intervening adhesive. FIGS. 1A and 1B schematically illustrate cross-sectional side views of two elements 102, 104 prior to and after, respectively, a bonding process for forming a directly hybrid bonded structure 100 without an intervening adhesive in accordance with certain implementations described herein. As shown in FIGS. 1A and 1B, the bonded structure 100 can comprise a first element 102 and a second element 104 that are directly bonded to one another at a bond interface 118 without an intervening adhesive. The first and second elements 102, 104 can comprise microelectronic elements (e.g., semiconductor elements, including, for example, integrated device dies, wafers, passive devices, individual active devices such as power switches, etc.) and/or optical elements or devices (e.g., photodiodes; light emitting diodes (LEDs); quantum dot light emitting diodes (QLEDs); lasers; vertical-cavity surface-emitting lasers (VCSELs); transparency control pixels; liquid crystal pixels; adaptive optics; waveguides) that are stacked on or bonded to one another to form the bonded structure 100. For example, one or both of the first and second elements 102, 104 can comprise a thinned substrate or integrated device die having a thickness in a range of about 10 μm to 700 μm, in a range of about 10 μm to 300 μm, in a range of about 30 μm to 300 μm, or in a range of about 50 μm to 300 μm. Conductive features 106a (e.g., contact pads, exposed ends of vias (e.g., TSVs), or a through substrate electrodes) of the first element 102 can be electrically connected to corresponding conductive features 106b of the second element 104. In certain implementations, the conductive features 106a comprise an electrically conductive material that is optically transparent (e.g., indium tin oxide (ITO), indium-doped zinc oxide (IZO), tin oxide (SnO$_2$)) or optically semi-transparent (e.g., metal or polysilicon layer having a thickness less than 50 nanometers).

While FIGS. 1A and 1B schematically illustrate two elements 102, 104, any suitable number of elements can be stacked in the bonded structure 100 in accordance with certain implementations described herein. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In certain implementations, the laterally stacked additional element can be smaller than the second element 104 (e.g., the laterally stacked additional element can be two times smaller than the second element 104).

In certain implementations, the elements 102, 104 are directly bonded to one another without an adhesive. Bonding layers can be provided on front sides and/or back sides of the first and second elements 102, 104. For example, as schematically illustrated in FIGS. 1A and 1B, a first bonding layer 108a of the first element 102 can comprise a noncon-ductive field region of the first element 102 that includes a nonconductive or dielectric material (e.g., a dielectric material, such as silicon oxide, or an undoped semiconductor material, such as undoped silicon) and a second bonding layer 108b of the second element 104 can comprise a nonconductive field region of the second element 104 that includes a nonconductive or dielectric material (e.g., a dielectric material, such as silicon oxide, or an undoped semiconductor material, such as undoped silicon). The first and second bonding layers 108a, 108b can be disposed on respective front sides 114a, 114b of device portions 110a, 110b, such as semiconductor (e.g., silicon) portions, of the first and second elements 102, 104. Active devices (e.g., electrical devices; optical devices) and/or circuitry can be patterned and/or otherwise disposed in or on the device portions 110a, 110b, disposed at or near the front sides 114a, 114b of the device portions 110a, 110b, and/or at or near opposite backsides 116a, 116b of the device portions 110a, 110b.

The first and second bonding layers 108a, 108b can be directly bonded to one another without an adhesive (e.g., using dielectric-to-dielectric bonding techniques). For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In certain implementations, the dielectric materials do not comprise polymer materials, such as epoxy, resin or molding materials.

In certain implementations, the device portions 110a, 110b can have significantly different coefficients of thermal expansion (CTEs) defining a heterogenous structure. The CTE difference between the device portions 110a, 110b, and particularly between bulk semiconductor (e.g., typically single crystal) portions of the device portions 110a, 110b can be greater than 5 ppm or greater than 10 ppm. For example, the CTE values for certain materials compatible with certain implementations described herein are in a range of 2 ppm to 10 ppm and the CTE difference between the device portions 110a, 110b can be in a range of 1 ppm to 10 ppm, 2 ppm to 10 ppm, or 5 ppm to 40 ppm. In certain implementations, one of the device portions 110a, 110b can comprise opto-electronic single crystal materials, including perovskite materials, that are useful for optical piezoelectric or pyro-electric applications, and the other of the device portions 110a, 110b can comprise a more conventional substrate material. For example, one of the device portions 110a, 110b can comprise lithium tantalate (LiTaO$_3$) or lithium niobate (LiNbO$_3$), and the other one of the device portions 110a, 110b can comprise silicon (Si), quartz, fused silica glass, sapphire, or a glass. In certain other implementations, one of the device portions 110a, 110b comprises a III-V single semiconductor material, such as gallium arsenide (GaAs) or gallium nitride (GaN), and the other one of the device portions 110a, 110b comprises a non-III-V semiconductor material, such as silicon (Si), or another materials with similar CTE, such as quartz, fused silica glass, sapphire, or a glass.

In certain implementations, direct hybrid bonds can be formed without an intervening adhesive. For example, bonding surfaces 112a, 112b of the nonconductive field regions of the bonding layers 108a, 108b can be polished to a high degree of smoothness (e.g., using chemical mechanical polishing (CMP)). The roughness of the polished surfaces 112a, 112b can be less than 30 Å rms. For example, the roughness of the polished surfaces 112a, 112b can be in a range of about 0.1 Å rms to 15 Å rms, 0.5 Å rms to 10 Å rms, or 1 Å rms to 5 Å rms. The surfaces 112a, 112b can be cleaned and exposed to plasma and/or chemical etchants to activate the surfaces 112a, 112b. In certain implementations, the surfaces 112a, 112b can be terminated with a species after activation or during activation (e.g., during the plasma and/or etch processes). Without being limited by theory, in certain implementations, the activation process can be performed to break chemical bonds at the surfaces 112a, 112b, and the termination process can provide additional chemical species at the surfaces 112a, 112b that improves the bonding energy during direct bonding. In certain implementations, the activation and termination are provided in the same step (e.g., a plasma to activate and terminate the surfaces 112a, 112b). In certain other implementations, the surfaces 112a, 112b are terminated in a separate treatment from the activation process to provide the additional species for direct bonding. In certain implementations, the terminating species can comprise nitrogen. For example, one or both of the surfaces 112a, 112b can be exposed to a nitrogen-containing plasma (see, e.g., U.S. Pat. No. 7,387,944). Further, in certain implementations, one or both of the surfaces 112a, 112b are exposed to fluorine. For example, there may be one or multiple fluorine peaks at or near a bond interface 118 between the first and second elements 102, 104. Thus, in the directly bonded structure 100, the bond interface 118 between two nonconductive materials (e.g., the first and second bonding layers 108a, 108b) can comprise a very smooth interface with higher nitrogen content and/or fluorine peaks at the bond interface 118 (see, e.g., U.S. Pat. No. 9,564,414). Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished surfaces 112a, 112b can be slightly rougher (e.g., about 1 Å rms to 30 Å rms, 3 Å rms to 20 Å rms, or possibly rougher) after an activation process.

In certain implementations, the conductive features 106a of the first element 102 are directly bonded to the corresponding conductive features 106b of the second element 104. For example, a direct hybrid bonding technique can be used to provide conductor-to-conductor direct bonds along the bond interface 118 that includes covalently direct bonded non-conductive-to-non-conductive (e.g., dielectric-to-dielectric) surfaces, prepared as described herein. In certain implementations, the conductor-to-conductor (e.g., conductive feature 106a to conductive feature 106b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. In direct hybrid bonding implementations described herein, conductive features are provided within the nonconductive field regions of the first and second bonding layers 108a, 108b, and both conductive and nonconductive features are prepared for direct bonding, such as by the planarization, activation and/or termination treatments described herein. Thus, the first and second bonding layers 108a, 108b prepared for direct bonding includes both conductive and nonconductive features.

For example, surfaces 112a, 112b of the nonconductive (e.g., dielectric) field regions (for example, inorganic dielectric surfaces) can be prepared and directly bonded to one another without an intervening adhesive as explained herein. Conductive contact features (e.g., conductive features 106a, 106b) can be at least partially surrounded by nonconductive (e.g., dielectric) field regions within the first and second bonding layers 108a, 108b and can directly bond to one another without an intervening adhesive. In certain implementations, the conductive features 106a, 106b can comprise discrete pads or traces at least partially embedded in the nonconductive material of the bonding layers 108a, 108b. In certain implementations, the conductive contact features comprise exposed contact surfaces of through substrate vias (e.g., through silicon vias (TSVs)). In certain implementations, the respective conductive features 106a, 106b can be recessed below the exterior (e.g., upper) surfaces (e.g., nonconductive bonding surfaces 112a, 112b) of the nonconductive portions of the first and second bonding layers 108a, 108b. For example, the recess can be less than 30 nm, less than 20 nm, less than 15 nm, or less than 10 nm, in a range of 2 nm to 20 nm, or in a range of 4 nm to 10 nm. In certain implementations, prior to direct bonding, the recesses in the opposing elements 102, 104 can be sized such that the total gap between opposing contact pads is less than 15 nm or less than 10 nm.

In certain implementations, the first and second bonding layers 108a, 108b are directly bonded to one another without an adhesive at room temperature and, subsequently, the bonded structure 100 can be annealed. Upon annealing, the conductive features 106a, 106b can expand and contact one another to form a metal-to-metal direct bond. In certain implementations, the materials of the conductive features 106a, 106b interdiffuse with one another during the annealing process. Beneficially, the use of Direct Bond Interconnect (DBI®) techniques commercially available from Adeia of San Jose, CA, can enable high density of conductive features 106a, 106b to be connected across the direct bond interface 118 (e.g., small or fine pitches for regular arrays). In certain implementations, the pitch of the conductive features 106a, 106b (e.g., conductive traces embedded in the bonding layer 108a, 108b of one of the bonded elements 102, 104) can be less than 100 microns or less than 10 microns or even less than 2 microns. For some applications, the ratio of the pitch of the conductive features 106a, 106b to one of the dimensions (e.g., a diameter) of the bonding pad is less than is less than 20, or less than 10, or less than 5, or less than 3 and sometimes desirably less than 2. In other applications, the width of the conductive traces embedded in the bonding layer 108a, 108b of one of the bonded elements 102, 104 is in a range between 0.3 micron to 20 microns (e.g., in a range of 0.3 micron to 3 microns). In certain implementations, the conductive features 106a, 106b and/or traces comprise copper or copper alloys, gold and gold alloys, nickel and nickel alloys, aluminum and aluminum alloys, although other metals and alloys may be suitable. For example, the conductive features disclosed herein, such as the conductive features 106a, 106b, can comprise fine-grain metal (e.g., a fine-grain copper).

Thus, in direct bonding processes, the first element 102 can be directly bonded to the second element 104 without an intervening adhesive. In certain implementations, the first element 102 comprises a singulated element, such as a singulated integrated device die. In certain other implementations, the first element 102 comprises a carrier or substrate (e.g., a wafer) that includes a plurality (e.g., tens, hundreds, or more) of device regions that, when singulated, form a plurality of integrated device dies. Similarly, in certain implementations, the second element 104 comprises a singulated element, such as a singulated integrated device die. In certain other implementations, the second element 104 comprises a carrier or substrate (e.g., a wafer). Certain implementations disclosed herein can accordingly apply to wafer-to-wafer (W2W), die-to-die (D2D), or die-to-wafer (D2W), wafer to flat panel (W2FP), die to flat panel (D2FP), flat panel to flat panel (FP2FP) bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements 102, 104) can be substantially flush and can include markings indicative of the common singulation process for the bonded structure (e.g., saw markings if a saw singulation process is used).

As explained herein, the first and second elements 102, 104 can be directly bonded to one another without an adhesive, which is different from a deposition process and results in a structurally different interface compared to a deposition. In certain implementations, a width of the first element 102 in the bonded structure is similar to a width of the second element 104. In certain other implementations, a width of the first element 102 in the bonded structure 100 is different from a width of the second element 104. Similarly, the width or area of the larger of the first and second elements 102, 104 in the bonded structure can be at least 10% larger than the width or area of the smaller of the first and second elements 102, 104. The first and second elements 102, 104 can accordingly comprise non-deposited elements. Further, the directly bonded structures 100, unlike the deposited layers, can include a defect region along the bond interface 118 in which nanometer-scale voids (e.g., nanovoids) are present. The nanovoids can be formed due to activation of the bonding surfaces 112a, 112b (e.g., exposure to a plasma). As explained herein, the bond interface 118 can include concentration of materials from the activation and/or last chemical treatment processes. For example, in certain implementations that utilize a nitrogen plasma for activation, a nitrogen peak can be formed at the bond interface 118. The nitrogen peak can be detectable using secondary ion mass spectroscopy (SIMS) techniques. In certain implementations, for example, a nitrogen termination treatment (e.g., exposing the bonding surface to a nitrogen-containing plasma) can replace OH groups of a hydrolyzed (OH-terminated) surface with $NH_2$, NO, or $NO_2$ molecules, yielding a nitrogen-terminated surface. In certain implementations that utilize an oxygen plasma for activation, an oxygen peak can be formed at the bond interface 118. In certain implementations, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108a, 108b can also comprise polished surfaces 112a, 112b that are planarized to a high degree of smoothness.

In certain implementations, the metal-to-metal bonds between the conductive features 106a, 106b can be joined such that metal grains grow into each other across the bond interface 118. In certain implementations, the metal is or includes copper, which can have grains oriented along the <111> crystal plane for improved copper diffusion across the bond interface 118. In certain implementations, the conductive features 106a, 106b include nanotwinned copper grain structure, which can aid in merging the conductive features during anneal. The bond interface 118 can extend substantially entirely to at least a portion of the bonded conductive features 106a, 106b, such that there is substantially no gap between the nonconductive bonding layers 108a, 108b at or near the bonded conductive features 106a, 106b. In certain implementations, a barrier layer may be provided under and/or laterally surrounding the conductive features 106a, 106b (e.g., which may include copper). In certain other implementations, however, there may be no barrier layer under the conductive features 106a, 106b, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 106a, 106b, and/or small pad sizes. For example, in certain implementations, the pitch p (e.g., the distance from edge-to-edge or center-to-center, as shown in FIG. 1A) between adjacent conductive features 106a (or between adjacent conductive features 106b) can be in a range of 0.5 micron to 50 microns, in a range of 0.75 micron to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 micron to 30 microns, in a range of 0.25 micron to 5 microns, or in a range of 0.5 micron to 5 microns.

Certain implementations disclosed herein relate to optoelectronic devices that include directly bonded contacts comprising optically transparent or optically semi-transparent electrical conducting material (referred to herein collectively as transparent conductors or TCs) instead of metal direct bonded contacts. For example, the optoelectronic devices can include optical elements or devices (e.g., photodiodes; light emitting diodes (LEDs)); quantum dot light emitting diodes (QLEDs); lasers; vertical-cavity surface-emitting lasers (VCSELs); transparency control pixels; liquid crystal pixels; adaptive optics; solar cells; waveguides; spatial light modulators; diode lasers; electrochromic devices) that are stacked on or bonded to one another to form a bonded structure. The TCs on separate substrates can be planarized and the planarized surfaces of the substrates can be placed in contact with one another, as described herein, to form the bonded structures.

In certain implementations, the optoelectronic devices described herein are configured to be used in various contexts which are area-limited (e.g., displays for virtual reality (VR) or augmented reality (AR) applications; multijunction solar cells) or other designs comprising an electrooptical element within a stack of other optical elements, beneficially utilizing the TCs for providing electrical connection between electrical elements while not appreciably blocking light.

As used herein, the term "optically transparent" includes but is not limited to optically translucent, optically semi-transparent, and/or having an optical transmittance of at least 50% (e.g., at least 60%; at least 75%; at least 88%; greater than or equal to 95%) at optical wavelengths in a predetermined range. For example, the predetermined range for optically transparent components (e.g., elements; substrates; layers; devices; features) can be visible wavelengths (e.g., 390 nanometers to 750 nanometers; 400 nanometers to 700 nanometers), ultraviolet wavelengths (e.g., 100 nanometers to 400 nanometers), infrared wavelengths (e.g., 800 nanometers to 1 millimeter), and/or short-wave infrared (SWIR) wavelengths (e.g., 1400 nanometers to 3000 nanometers).

Figure 2A:
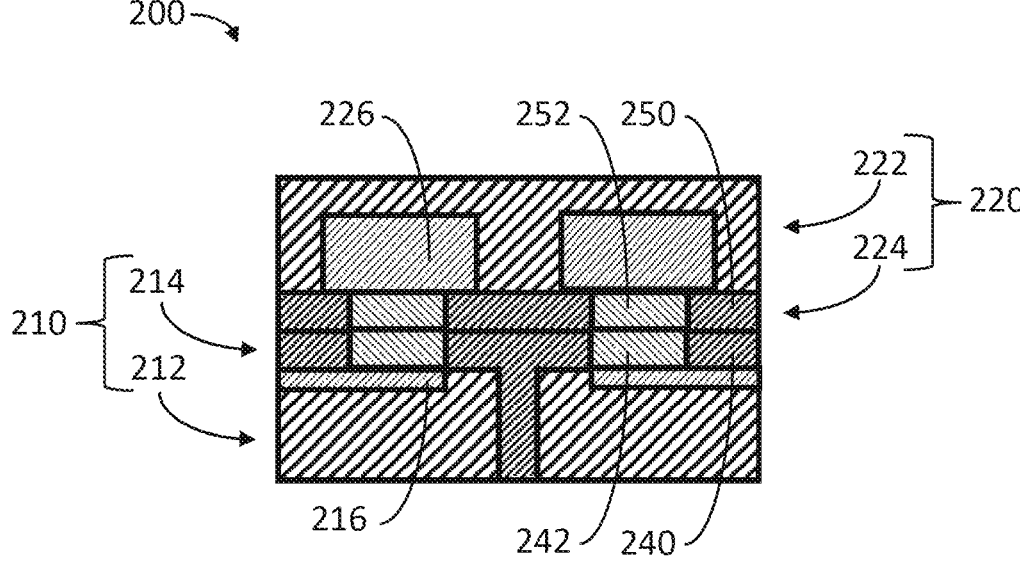
FIGS. 2A and 2B schematically illustrate cross-sectional views of two example structures compatible with certain implementations described herein.
Figure 2B:
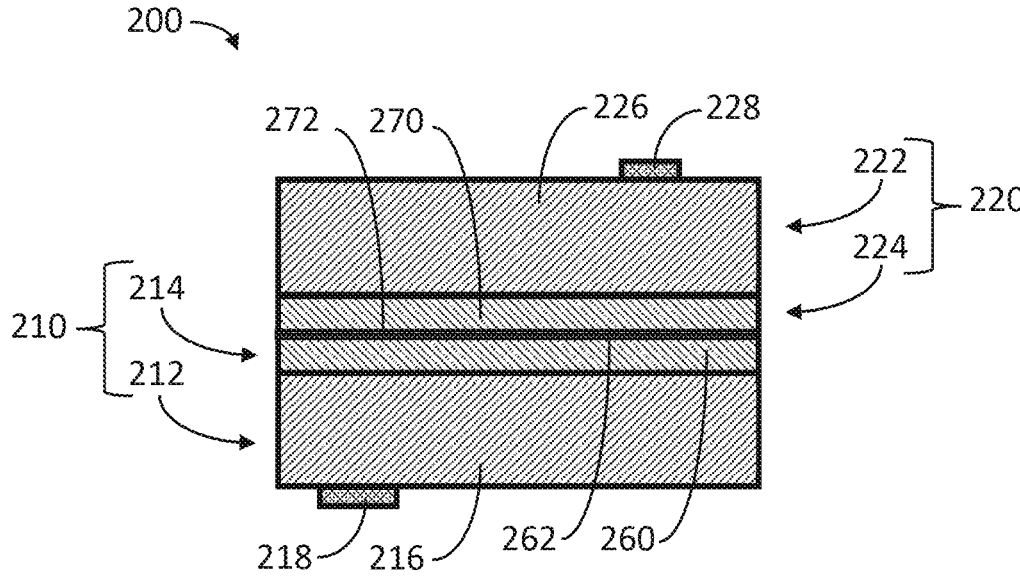

FIGS. 2A and 2B schematically illustrate two example structures 200 compatible with certain implementations described herein. The structure 200 comprises at least one first element 210 (e.g., first element 102) comprising an optically transparent first substrate 212 (e.g., device portion 110a) and an optically transparent first surface layer 214, and at least one second element 220 (e.g., second element 104) comprising an optically transparent second substrate 222 (e.g., device portion 110b) and an optically transparent second surface layer 224. The first surface layer 214 and the second surface layer 224 are directly bonded to one another without adhesive.

The first substrate 212 can comprise at least one first device 216 and the second substrate 222 can comprise at least one second device 226. For example, as schematically illustrated by FIG. 2A, the first substrate 212 comprises a plurality of first devices 216 (e.g., electrical conduits) and the second substrate 222 comprises a plurality of second devices 226 (e.g., optoelectronic devices). While FIG. 2A shows the first devices 216 of the first substrate 212 comprise optically transparent electrical conduits, in certain other implementations, the first devices 216 comprise non-optically transparent electrical conduits (e.g., the non-optically transparent electrical conduits not blocking the entire light path through the first devices 216). For another example, as schematically illustrated by FIG. 2B, the first substrate 212 comprises a single first device 216 (e.g., optoelectronic device; electro-optical element; solar cell) and the second substrate 222 comprises a single second device 226 (e.g., optoelectronic device; electro-optical element; control device).

In certain implementations, the first element 210 comprises at least one electro-optical (EO) contact 218 (e.g., a large lateral area contact on a backside 116a of the corresponding device portion 110a) in electrical and/or optical communication with the at least one first device 216 and the second element 220 comprises at least one electro-optical (EO) contact 228 (e.g., on a backside 116b of the corresponding device portion 110b) in electrical and/or optical communication with the at least one second device 226. The EO contacts 218, 228 can be configured to transmit electrical and/or optical signals to and/or from the first and/or second devices 216, 226. Example materials for the EO contacts 218, 228 include but are not limited to copper or copper alloys, although other metals and alloys may be suitable, including the transparent conductors disclosed herein. In addition, the EO contacts 218, 228 can comprise additional electrically conductive layers between the copper and the corresponding first and/or second substrate 212, 222.

In certain implementations, the first surface layer 214 comprises one or more electrically insulative regions 240 and one or more electrically conductive regions 242, and the second surface layer 224 comprises one or more electrically insulative regions 250 and one or more electrically conductive regions 252. For example, as schematically illustrated by FIG. 2A, the first surface layer 214 can comprise at least one electrically insulative first region 240 (e.g., bonding layer 108a) and at least one electrically conductive second region 242 (e.g., conductive feature 106a), and the second surface layer 224 can comprise at least one electrically insulative third region 250 (e.g., bonding layer 108b) and at least one electrically conductive fourth region 252 (e.g., conductive feature 106b). The at least one first region 240 is directly bonded to the at least one third region 250 and the at least one second region 242 is directly bonded to the at least one fourth region 252, the at least one second region 242 and the at least one fourth region 252 providing an electrically conductive and optically transparent connection between the at least one first element 210 and the at least one second element 220.

The at least one electrically insulative first region 240 and the at least one electrically insulative third region 250 can comprise an optically transparent dielectric material (e.g., an inorganic dielectric material), examples of which include, but are not limited to: semiconductor oxides, semiconductor nitrides, silicon oxide ($SiO_2$), silicon nitride ($SiN_x$; $Si_3N_4$). The at least one electrically conductive second region 242 and the at least one electrically conductive fourth region 252 can comprise an optically transparent and electrically conductive material, examples of which include, but are not limited to: doped and undoped metal oxides, aluminum zinc oxide (AZO), indium tin oxide (ITO; $In_2O_3$), zinc oxide (ZnO), zinc tin oxide ($ZnSnO_3$; $Zn_2SnO_4$), indium-doped zinc oxide (IZO), indium oxide, cadmium tin oxide ($Cd_2SnO_4$), tin oxide ($SnO_2$), titanium dioxide ($TiO_2$), niobium-doped titanium dioxide (Nb—$TiO_2$), titanium nitride (TiN), and transition metal nitrides comprising a IIIB, IVB, or VB transition metal. The first and third regions 240, 250 can comprise the same optically transparent dielectric material or can comprise different optically transparent dielectric materials (e.g., materials having different elemental constituents and/or different stoichiometries; the direct bonding comprising direct hybrid bonding).

In certain implementations, the first surface layer 214 comprises at least one electrically conductive layer and the second surface layer 224 comprises at least one electrically conductive layer. The at least one electrically conductive layer of the first and/or second surface layers 214, 224 can comprise an optically transparent and electrically conductive material, examples of which include, but are not limited to: doped and undoped metal oxides, aluminum zinc oxide (AZO), indium tin oxide (ITO; $In_2O_3$), zinc oxide (ZnO), zinc tin oxide ($ZnSnO_3$; $Zn_2SnO_4$), indium-doped zinc oxide (IZO), indium oxide, cadmium tin oxide ($Cd_2SnO_4$), tin oxide ($SnO_2$), titanium dioxide ($TiO_2$), niobium-doped titanium dioxide (Nb—$TiO_2$), titanium nitride (TiN), and transition metal nitrides comprising a IIB, IVB, or VB transition metal. The at least one electrically conductive layer of the first and second surface layers 214, 224 can comprise the same optically transparent and electrically conductive material or can comprise different optically transparent and electrically conductive materials (e.g., materials having different elemental constituents and/or different stoichiometries; different alloys; the direct bonding comprising direct hybrid bonding).

In certain implementations, the first surface layer 214 comprises a single surface layer and/or the second surface layer 224 comprises a single surface layer, with the two single surface layers directly bonded to one another. In certain other implementations, at least one of the first surface layer 214 and the second surface layer 224 comprises multiple surface layers. For example, as schematically illustrated by FIG. 2B, the first surface layer 214 can comprise an electrically conductive first layer 260 and an electrically conductive second layer 262 over the first layer 260, and the second surface layer 224 can comprise an electrically conductive third layer 270 and an electrically conductive fourth layer 272 over the third layer 270. The first and third layers 260, 270 can comprise an optically transparent and electrically conductive material, examples of which include, but are not limited to: doped and undoped metal oxides, aluminum zinc oxide (AZO), indium tin oxide (ITO; $In_2O_3$), zinc oxide (ZnO), zinc tin oxide ($ZnSnO_3$; $Zn_2SnO_4$), indium-doped zinc oxide (IZO), indium oxide, cadmium tin oxide ($Cd_2SnO_4$), tin oxide ($SnO_2$), titanium dioxide ($TiO_2$), niobium-doped titanium dioxide (Nb—$TiO_2$), titanium nitride (TiN), tin nitride ($Sn_3N_4$) and other metal nitrides (e.g., $A_3N_2$ where A=Mg, Zn, Sn). The first and third layers 260, 270 can comprise the same optically transparent and electrically conductive material or can comprise different optically transparent and electrically conductive materials (e.g., materials having different elemental constituents and/or different stoichiometries; different alloys; the direct bonding comprising direct hybrid bonding).

The second and fourth layers 262, 272 can comprise a metal or polysilicon layer that is sufficiently thin (e.g., less than or equal to 50 nanometers) so that the metal or polysilicon layer is optically transparent (e.g., semitransparent) while being electrically conductive. Examples of metals for the metal layers compatible with certain implementations described herein include, but are not limited to: metal elements (e.g., gold, silver, aluminum, copper, iridium, iron, nickel, osmium, palladium, platinum, rhenium, rhodium, ruthenium, zinc) and electrically conductive alloys that include one or more of these metal elements. While FIG. 2B schematically illustrates each of the first and second surface layers 214, 224 comprising two layers, in certain other implementations, only one of the first and second surface layers 214, 224 comprises two layers while the other comprises a single layer. For example, the first surface layer 214 can comprise the first and second layers 260, 262, and second surface layer 224 can comprise only the third layer 270. The second and fourth layers 262, 272 can comprise the same metal or polysilicon material or can comprise different metal or polysilicon materials (e.g., materials having different elemental constituents and/or different stoichiometries; different alloys; the direct bonding comprising direct hybrid bonding). In certain implementations in which the roughness of the exterior surface of the first layer 260 and/or the third layer 270 is too rough (e.g., not smooth enough) for direct bonding of the first and third layers 260, 270 or the materials of the first and third layers 260, 270 do not readily directly bond to one another, the second layer 262 and/or the fourth layer 272 can facilitate direct bonding between the first and second surface layers 214, 224.

Figure 3:
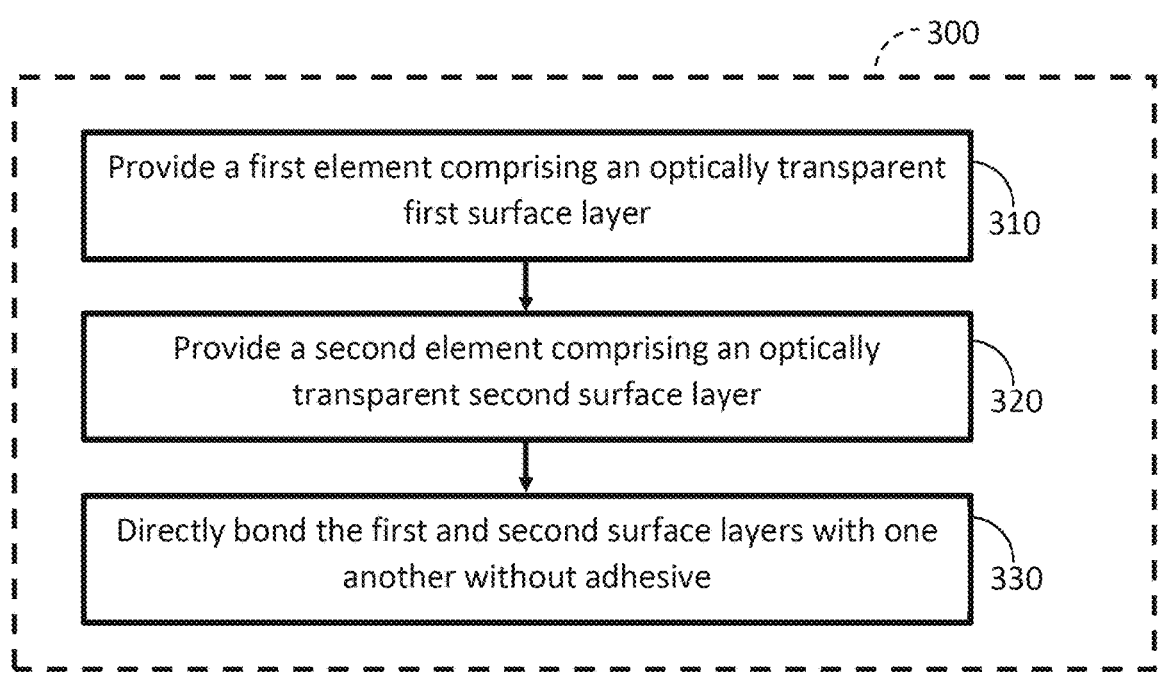
FIG. 3 is a flow diagram of an example method for forming a structure compatible with certain implementations described herein.
Figure 4A:
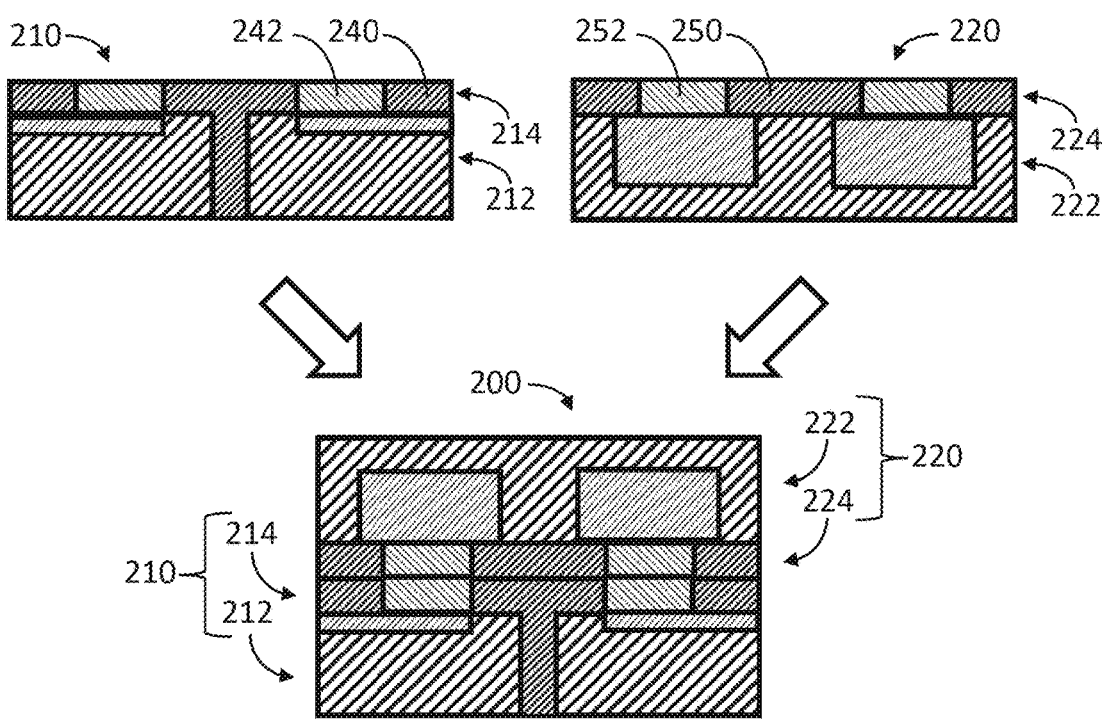
FIGS. 4A and 4B schematically illustrate cross-sectional views during fabrication using the example method of FIG. 3 to form the example structures of FIGS. 2A and 2B, respectively, in accordance with certain implementations described herein.
Figure 4B:
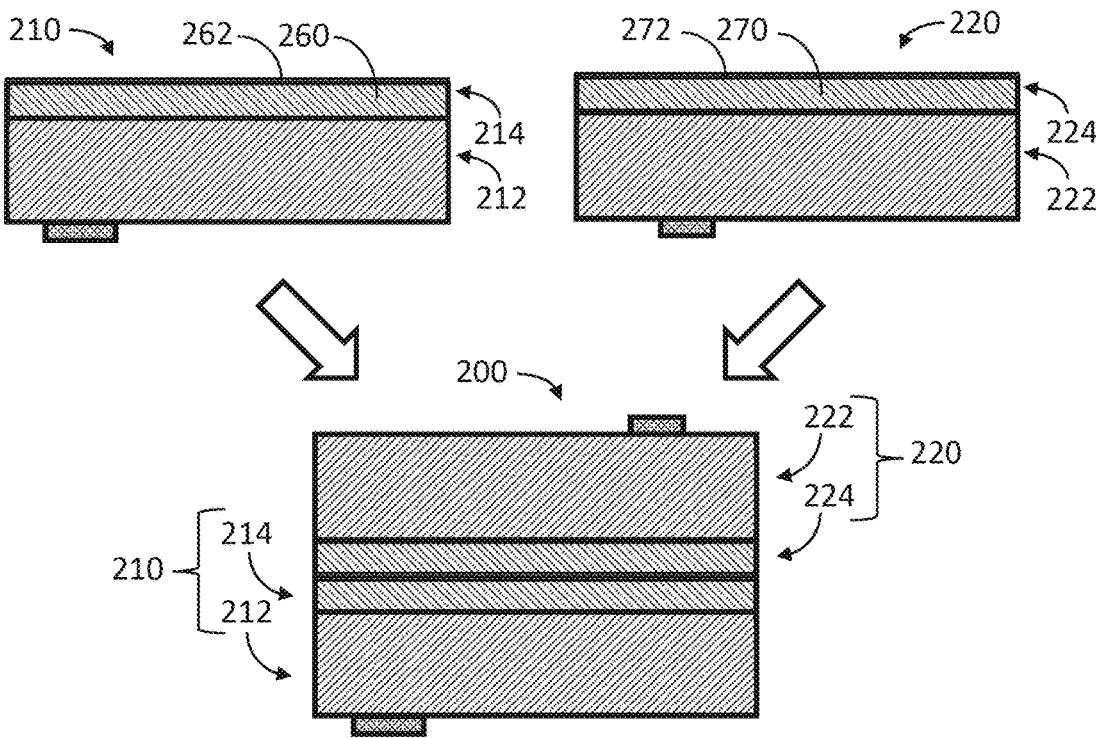

FIG. 3 is a flow diagram of an example method 300 for forming a structure 200 (e.g., a structure comprising dielectric-to-dielectric bonding) compatible with certain implementations described herein. FIGS. 4A and 4B schematically illustrate the example method 300 forming the example structures 200 of FIGS. 2A and 2B, respectively, in accordance with certain implementations described herein. While the example method 300 is described herein by referring to the various example structures of FIGS. 2A, 2B, 4A, and 4B, other structures are also compatible with the example method 300 in accordance with certain implementations described herein.

In an operational block 310, the method 300 comprises providing a first element 210 comprising an optically transparent first substrate 212 and an optically transparent first surface layer 214. In an operational block 320, the method 300 further comprises providing a second element 220 comprising an optically transparent second substrate 222 and an optically transparent second surface layer 224. In an operational block 330, the method 300 further comprises directly bonding the first and second surface layers 214, 224 with one another without adhesive. The directly bonding comprises contacting the first and second surface layers 214, 224 with one another.

As schematically illustrated by FIG. 4A, the first surface layer 214 can comprise electrically insulative first regions

240 and electrically conductive second regions 242 and the second surface layer 224 can comprise electrically insulative third regions 250 and electrically conductive fourth regions 252. The second regions 242 are at least partially embedded (e.g., coplanar) with the first regions 240 and the fourth regions 252 are at least partially embedded (e.g., coplanar) with the third regions 250. The top surfaces of the second regions 242 can be recessed (e.g., by less than 10 nanometers) relative to the top surfaces of the first regions 240 and/or the top surfaces of the fourth regions 252 can be recessed (e.g., by less than 10 nanometers) relative to the top surfaces of the third regions 250. After the insulating regions 240, 250 are brought into contact with one another (e.g., after activation) to form covalent bonds at room temperatures, the structure 200 can be annealed which causes the second regions 242 to expand and contact the fourth regions 252 (or vice versa), closing the gaps corresponding to the recesses. The direct hybrid bonding of the two surface layers 214, 224 to one another without adhesive (e.g., using the Direct Bond Interconnect (DBI®) techniques commercially available from Adeia of San Jose, CA) can comprise contacting the first and third regions 240, 250 with one another and contacting the second and fourth regions 242, 252 with one another (e.g., at room temperature) such that the first and third regions 240, 250 directly bond to one another and the second and fourth regions 242, 252 directly bond to one another (e.g., forming the structure 200 schematically illustrated by FIG. 2A). The alignment between the second regions 242 and the fourth regions 252 being directly bonded to one another can be sufficient to provide substantial electrical contact between the second regions 242 and the fourth regions 252 where desired (e.g., the regions 242, 252 do not have to be perfectly aligned with one another).

As schematically illustrated by FIG. 4B, the first surface layer 214 can comprise an electrically conductive first layer 260 and an electrically conductive second layer 262 over the first layer 260, and the second surface layer 224 can comprise an electrically conductive third layer 270 and an electrically conductive fourth layer 272 over the third layer 270. The direct hybrid bonding of the two surface layers 214, 224 to one another without adhesive (e.g., using the Direct Bond Interconnect (DBI®) techniques commercially available from Adeia of San Jose, CA) can comprise contacting the second and fourth layers 262, 272 with one another (e.g., at room temperature) such that the second and fourth layers 262, 272 directly bond to one another (e.g., forming the structure 200 schematically illustrated by FIG. 2A). In certain implementations, the first surface layer 214 comprises the first layer 260 and the second layer 262 and the second surface layer 224 comprises the third layer 270 and the fourth layer 272, while in certain other implementations, the first surface layer 214 comprises the first layer 260 and the second layer 262 and the second surface layer 224 comprises only the third layer 270 (e.g., only the first surface layer 214 comprises a metal or polysilicon layer).

Prior to contacting the two surface layers 214, 224 with one another, the example method 300 can comprise cleaning (e.g., rinsing and spin drying) at least one of the two surface layers 214, 224 (e.g., both of the two surface layers 214, 224) and/or activating (e.g., exposing to a plasma and/or chemical etchants) at least one of the two surface layers 214, 224 (e.g., both of the two surface layers 214, 224) after the cleaning. After contacting the two surface layers 214, 224 with one another (e.g., after directly bonding the two surface layers 214, 224 to one another), the example method 300 can comprise annealing (e.g., heating to a predetermined temperature higher than room temperature for a predetermined time period) the two surface layers 214, 224 (e.g., to cause expansion of the second regions 242 and/or the fourth regions 252 such that the second regions 242 and fourth regions 252 contact one another).

In certain implementations, providing the first element 210 and/or providing the second element 220 comprises fabricating the first element 210 and/or the second element 220. FIGS. 5A-5D schematically illustrate example fabrication sequences for providing the first element 210 in accordance with certain implementations described herein. While the example fabrication sequences of FIGS. 5A-5D are for fabricating the first element 210, starting with the first substrate 212, the same example fabrication sequences can be used for fabricating the second element 220, starting with the second substrate 222. After the first and second elements 210, 220 are formed (e.g., using a fabrication sequence of FIGS. 5A-5D), the method 300 can further comprise directly bonding the first and second surface layers 214, 224 of the first and second elements 210, 220 to one another.

Figures 5A, 5B:
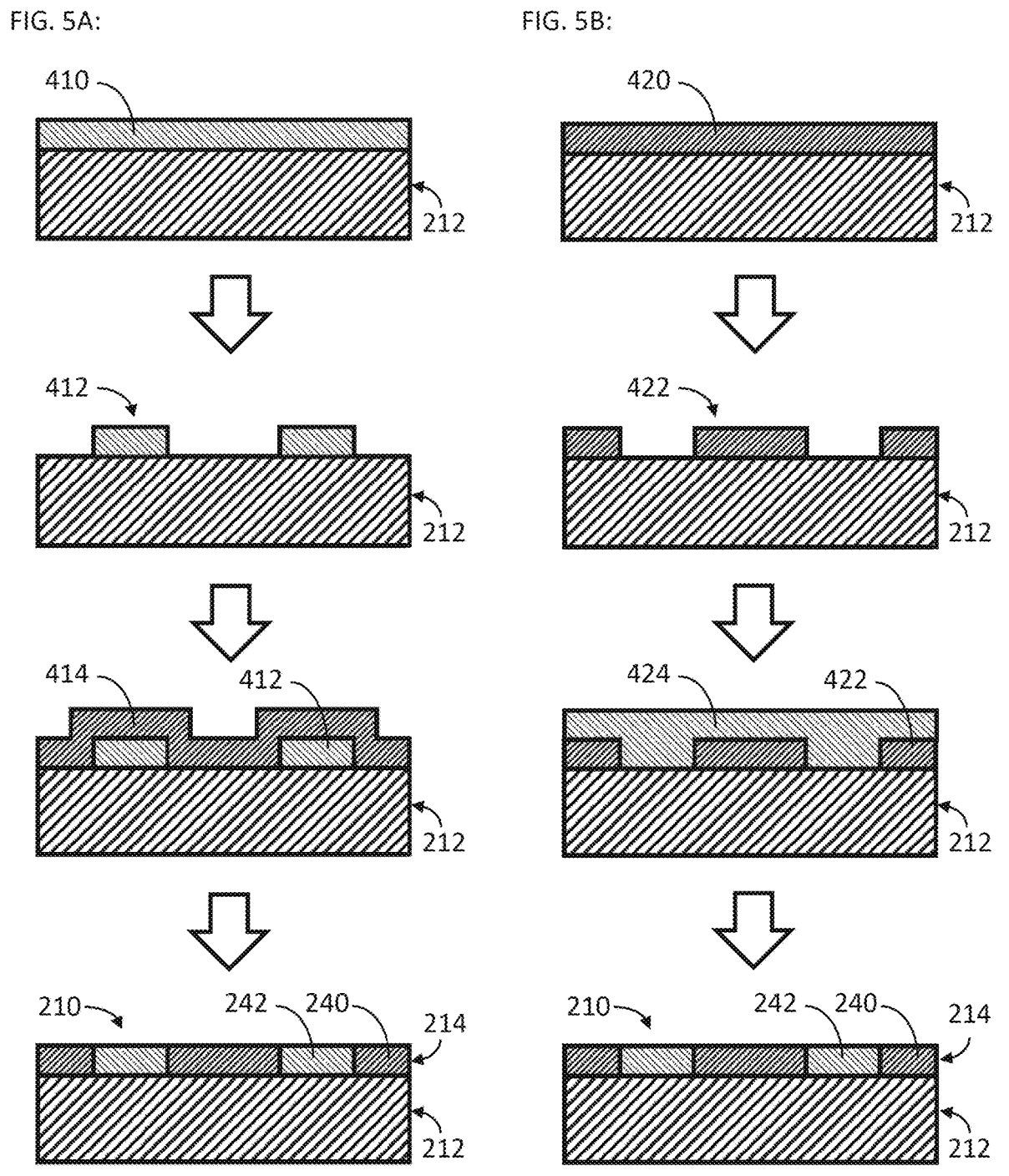

The example fabrication sequences of FIGS. 5A-5C can be used to form the first and second regions 240, 242 of the first surface layer 214 and/or to form the third and fourth regions 250, 252 of the second surface layer 224. In addition, while the example fabrication sequence of FIG. 5C starts with the first element 210 resulting from the fabrication sequences of FIGS. 5A or FIG. 5B (e.g., a first element 210 comprising a first surface layer 214 with electrically insulative first regions 240 and electrically conductive second regions 242; see FIGS. 2A and 4A), the same example fabrication sequence can be used for fabricating a first element 210 comprising a first surface layer 214 with an electrically conductive first layer 260 and an electrically conductive second layer 262 over the first layer 260 (e.g., see FIGS. 2B and 4B).

The example fabrication sequence of FIG. 5A comprises depositing an electrically conductive and optically transparent first material 410 on the first substrate 212 (e.g., by sputtering or activated chemical vapor deposition to a thickness on the order of microns). After being deposited, the first material 410 can be planarized (e.g., by chemical mechanical planarization (CMP)). The example fabrication sequence of FIG. 5A further comprises patterning the first material 410 (e.g., using photolithographic techniques) to form first structures 412 on the first substrate 212 (e.g., patterning ITO using dilute HCl, using HCl vapor in a plasma dry etch process, using $Cl_2$, $BCl_3$, $CH_4$, or $H_2$ as a dry etchant) for patterning ITO). The example fabrication sequence of FIG. 5A further comprises depositing an electrically insulative second material 414 on the first substrate 212 between and over the first structures 412 (e.g., to a thickness on the order of microns) and removing the second material 414 from over the first structures 412 (e.g., by CMP of the second material 414 thereby exposing the underlying first structures 412) such that the second material 414 between the first structures 412 form the first regions 240 and the first structures 412 form the second regions 242. This step also planarizes for bonding and can form recesses of the second regions 242 relative to the first regions 240.

The example fabrication sequence of FIG. 5B comprises depositing an electrically insulative first material 420 on the first substrate 212 (e.g., to a thickness on the order of microns) and patterning the first material 420 (e.g., using photolithographic techniques) to form first structures 422 on the first substrate 212. The example fabrication sequence of FIG. 5B further comprises depositing an electrically conductive and optically transparent second material 424 on the first substrate 212 between and over the first structures 422

(e.g., by sputtering or activated chemical vapor deposition to a thickness on the order of microns) and removing the second material 424 from over the first structures 422 (e.g., by CMP of the second material 424 thereby exposing the underlying first structures 422; e.g., a CMP rate of 50-60 nm/min can be used for ITO) such that the second material 424 between the first structures 422 form the second regions 242 and the first structures 422 form the first regions 240. In certain implementations, the deposited second material 424 has the surface topography of the underlying first structures 422, while in certain other implementations, the deposited second material 424 does not have the surface topography of the underlying first structures 422. As shown by FIGS. 5A and 5B, the deposition of the electrically conductive and optically transparent material can be either before or after an etching of a dielectric layer (e.g., a metal pad etch).

In certain implementations, the exterior surface of the second regions 242 is recessed relative to the exterior surface of the first regions 240, while in certain other implementations, the exterior surface of the first regions 240 is recessed relative to the exterior surface of the second regions 242. The thicknesses of the first and second regions 240, 242 can be tailored to provide a recess between the surfaces of the first and second regions 240, 242 (e.g., in a range of 2 nanometers to 8 nanometers) to account for the differing coefficients of thermal expansion (CTE) of the first material 410 and second material 414 (e.g., differing amounts of thermal expansion in a direction perpendicular to the first and second surface layers 214, 224 during the annealing of the first and second surface layers 214, 224). For example, the CTE of ITO is about $5.8 \times 10^{-6}$/K to $9 \times 10^{-6}$/K while the CTE of silicon oxide is about $0.5 \times 10^{-6}$/K. For comparison, the CTE of Cu is about $16.7 \times 10^{-6}$/K. As compared to using Cu as the electrically conductive material, the thickness of the ITO may be selected to be thicker and the magnitude of the recess between the ITO and the neighboring silicon oxide may be more tightly controlled to account for the smaller CTE differential for ITO/$SiO_2$ as compared to Cu/$SiO_2$.

For example, the outer surface of the second region 242 can be recessed relative to the outer surface of the first region 240 and/or the outer surface of the fourth region 252 can be recessed relative to the outer surface of the third region 250, and the annealing during the direct bonding process can cause the electrically conductive material of the second region 242 and/or the fourth region 252 to expand such that the second region 242 and the fourth region 252 contact one another to form a direct bond therebetween. For another example, the outer surface of the first region 240 can be recessed relative to the outer surface of the second region 242 and/or the outer surface of the third region 250 can be recessed relative to the outer surface of the fourth region 252, and the annealing during the direct bonding process can cause the electrically insulative material of the first region 240 and/or the third region 250 to expand such that the first region 240 and the third region 250 contact one another to form a direct bond therebetween.

The example fabrication sequence of FIG. 5C comprises depositing a first photoresist material 430 on the first and second regions 240, 242 and removing the first photoresist material 430 from over the second regions 242. The example fabrication sequence of FIG. 5C further comprises depositing an optically transparent first layer 432 over the second regions 242. For example, a semi-transparent metal layer (e.g., having a thickness less than or equal to 50 nanometers) can be deposited using directional physical vapor deposition (PVD) or atomic layer deposition (ALD). For another example, an optically transparent polysilicon layer can be deposited (e.g., via physical vapor deposition of silicon). The surface of the deposited layer can maintain a recess of the second regions 242 relative to the surface of the first regions 240 and/or can maintain a planarity of the second regions 242. The example fabrications sequence of FIG. 5C further comprises removing (e.g., stripping) the first photoresist material 430 from over the first regions 240 and cleaning the surface, leaving the first layer 432 over the second regions 242, such that the second regions 240 form the first layer 260 and the first layer 432 forms the second layer 262 over the first layer 260 (e.g., the second layer 262 part of the second regions 242).

The example fabrication sequence of FIG. 5D comprises starting with the first substrate 212 and can comprise planarizing the first substrate 212 such that an electrically conductive area of an exterior surface of the first substrate 212 is exposed. The example fabrication sequence of FIG. 5D further comprises depositing an electrically conductive and optically transparent first material 410 on the first substrate 212 (e.g., by sputtering or activated chemical vapor deposition to a thickness on the order of microns). The deposition can create a stable film and can minimize nanovoid formation at the interface with the first substrate 212. After being deposited, the first material 410 can be planarized (e.g., by CMP to reduce roughness of the exterior surface of the first material 410) to form the first layer 260. The example fabrication sequence of FIG. 5D further comprises depositing a thin metal or polysilicon second layer 262 over the first layer 260 (e.g., having a thickness less than 50 nanometers). While the example fabrication sequence of FIG. 5D starts with the first substrate 212 to fabricate a first surface layer 214 with an electrically conductive first layer 260 and an electrically conductive second layer 262 over the first layer 260, the same example fabrication sequence can be used for fabricating a second surface layer 224 with an electrically conductive third layer 270 and an electrically conductive fourth layer 272 over the third layer 270.

Figure 6:
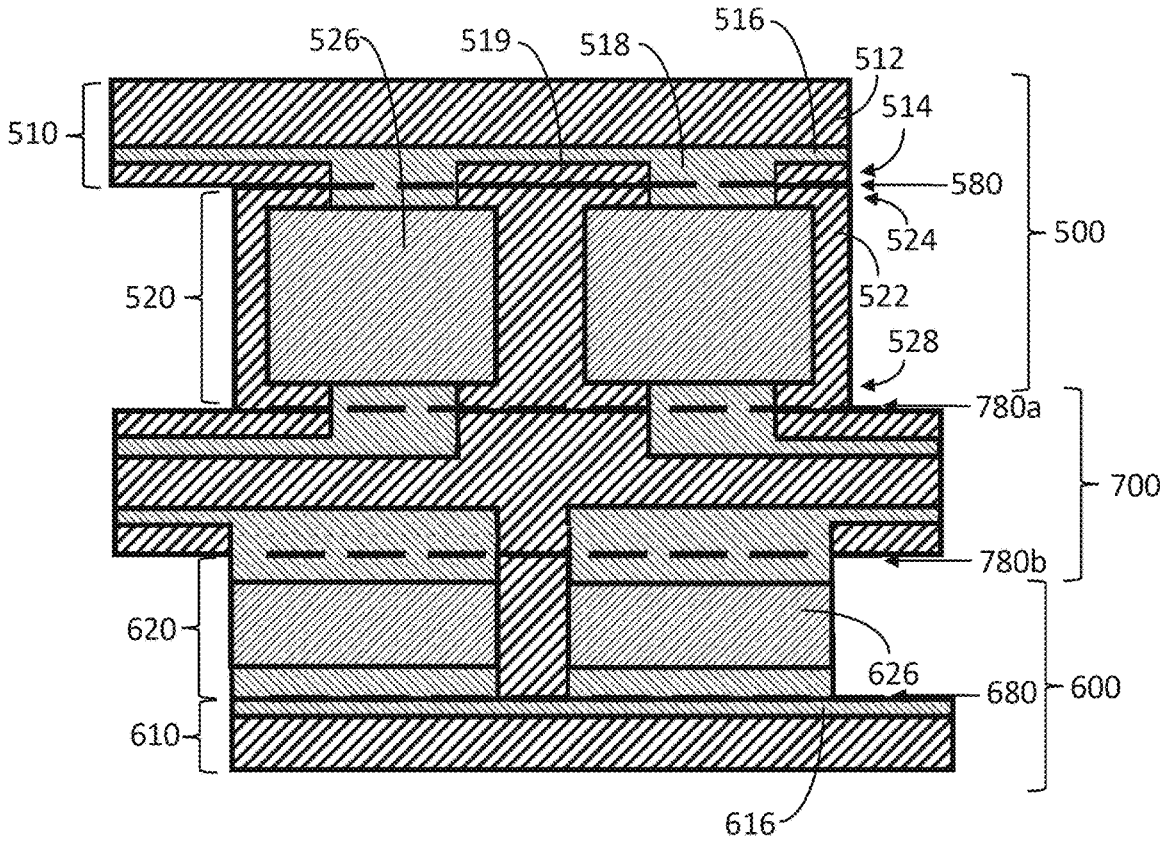
FIG. 6 schematically illustrates an example structure comprising a plurality of planar regions in accordance with certain implementations described herein.

FIG. 6 schematically illustrates an example structure 200 (e.g., VR/AR display) comprising a plurality of planar regions in accordance with certain implementations described herein. The example structure 200 of FIG. 6 comprises an LED assembly 500 comprising an LED backplane 510 (e.g., comprising an LED array ground plane 516) and an LED plane 520 (e.g., comprising a plurality of LEDs 526). The LED backplane 510 and the LED plane 520 are directly bonded to one another at a direct bonding (DB) interface 580 (denoted in FIG. 6 by a dashed line). The LED array ground plane 516 is in electrical communication with the LEDs 526. The example structure 200 of FIG. 6 further comprises a transparent pixel (TP) assembly 600 comprising a TP backplane 610 (e.g., comprising a TP array ground plane 616) and a TP plane 620 (e.g., comprising a plurality of transparent pixels 626 configured to control transmission of light from the LED assembly 500 through the TP assembly 600). The TP backplane 610 and the TP plane 620 are directly bonded to one another at a DB interface 680 (denoted in FIG. 6 by a dashed line). The TP array ground plane 616 is in electrical communication with the transparent pixels 626. The example structure 200 of FIG. 6 further comprises an interposer assembly 700 directly bonded to the LED assembly 500 at a DB interface 780a (denoted in FIG. 6 by a dashed line) and directly bonded to the TP assembly 600 at a DB interface 780b (denoted in FIG. 6 by a dashed line). In certain implementations, all the components schematically illustrated in FIG. 6 are optically transparent or optically semi-transparent. The interposer assembly 700 provides an interface with electrically conductive conduits to control the LEDs 526 of the LED assembly 500 and/or the transparent pixels 626 of the TP assembly 600, and the interposer assembly 700 can also make electrical connection to optically opaque components outside the view shown in FIG. 6.

As schematically illustrated in FIG. 6, the LED backplane 510 has a single DB interface 580 formed with the LED plane 520 and the TP backplane 610 has a single DB interface 680 formed with the TP plane 620. In addition, the LED plane 520 has two DB interfaces: the DB interface 580 formed with the LED backplane 510 and the DB interface 780a formed with the interposer assembly 700, and the TP plane has two DB interfaces: the DB interface 680 formed with the TP backplane 610 and the DB interface 780b formed with the interposer assembly 700.

Each of the LED assembly 500, the TP assembly 600, and the interposer assembly 700 can comprise corresponding optically transparent elements, substrates, layers, and devices as described herein with reference to FIGS. 1A, 1B, 2A, 2B, 4A, and 4B. For example, the LED backplane 510 (e.g., first element 210) comprises an LED backplane substrate 512 (e.g., first substrate 212) with LED backplane devices (e.g., electrical conduits; first devices 216; LED array ground plane 516) and an LED backplane layer 514 (e.g., first surface layer 214) on the LED backplane substrate 512. The LED backplane layer 514 comprises optically transparent and electrically conductive regions 518 (e.g., second regions 242 with an optically transparent conductive material) and electrically insulative regions 519 (e.g., first regions 240 with an optically transparent insulative material). The LED plane 520 comprising an LED plane substrate 522 (e.g., second substrate 222) comprising LED plane devices (e.g., LEDs 526; second devices 226) and a first LED plane surface layer 524 (e.g., second surface layer 214) comprising optically transparent and electrically conductive regions (e.g., fourth regions 252 with an optically transparent conductor material) and electrically insulative regions (e.g., third regions 250 with an optically transparent insulative material). In addition, the LED plane 520 further comprises a second LED plane surface layer 528 on an opposite side of the LED plane substrate 522 from the first LED plane surface layer 524. The second LED plane surface layer 528 also comprises optically transparent, electrically conductive regions and optically transparent, electrically insulative regions.

In certain implementations, the bonded structures (sec, e.g., FIGS. 2A, 2B, 4A, 4B) can be coated with a protective layer, mounted on a dicing sheet, and singulated (e.g., by saw dicing, laser dicing, reactive ion etch dicing, wet etching, or a combination thereof) to form singulated dies on the dicing frame. The protective layer can be removed (e.g., stripped) from the singulated dies and the exposed dicing sheet (e.g., using solvent, reactive ion etching, etc.). The singulated die can be cleaned (e.g., rinsed and dried using spin drying or other processes). The cleaned dies can be configured for subsequent processes. For example, a cleaned die can be further bonded to a prepared surface of another substrate (e.g., comprising a power pad, ground pads, and/or other passive elements configured to transmit power to the bonded die).

Although commonly used terms are used to describe the systems and methods of certain implementations for ease of understanding, these terms are used herein to be interpreted fairly. Although various aspects of the disclosure are described with regard to illustrative examples and implementations, the disclosed examples and implementations should not be construed as limiting. Conditional language, such as, among others, "can," "could," "might," or "may," unless specifically stated otherwise, or otherwise understood within the context as used, is generally intended to convey that certain implementations include, while other implementations do not include, certain features, elements and/or steps. Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

It is to be appreciated that the implementations disclosed herein are not mutually exclusive and may be combined with one another in various arrangements. In addition, although the disclosed methods and apparatuses have largely been described in the context of direct bonding processes, various implementations described herein can be incorporated in a variety of other suitable devices, methods, and contexts.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally." and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree. The ranges disclosed herein also encompass any and all overlap, sub-ranges, and combinations thereof. Language such as "up to," "at least," "greater than," less than," "between," and the like includes the number recited. As used herein, the meaning of "a," "an," and "said" includes plural reference unless the context clearly dictates otherwise. Also, as used in the description herein, the meaning of "in" includes "into" and "on," unless the context clearly dictates otherwise.

While the methods and systems are discussed herein in terms of elements labeled by ordinal adjectives (e.g., first, second, etc.), the ordinal adjective are used merely as labels to distinguish one element from another (e.g., one substrate from another or one surface layer from one another), and the ordinal adjective is not used to denote an order of these elements or of their use.

The disclosure described and claimed herein is not to be limited in scope by the specific example implementations herein disclosed, since these implementations are intended as illustrations, and not limitations, of several aspects of the disclosure. Any equivalent implementations are intended to be within the scope of this disclosure. Indeed, various modifications of the disclosure in form and detail, in addition to those shown and described herein, will become apparent to those skilled in the art from the foregoing description. Such modifications are also intended to fall within the scope of the claims. The breadth and scope of the disclosure should not be limited by any of the example implementations disclosed herein, but should be defined only in accordance with the claims and their equivalents.

What is claimed is:

1. An element comprising:
   a substrate; and
   a surface layer on the substrate, the surface layer comprising:
      at least one first region comprising an optically transparent and electrically insulative first material; and
      at least one second region at least partially embedded in the at least one first region, the at least one second region comprising an optically transparent and electrically conductive second material, wherein the second material is selected from the group consisting of: doped and undoped metal oxides, aluminum zinc oxide, indium tin oxide, zinc oxide, zinc tin oxide, indium-doped zinc oxide, indium oxide, cadmium tin oxide, tin oxide, titanium dioxide, niobium-doped titanium dioxide, and transition metal nitrides comprising a IIIB transition metal.

2. The element of claim 1, wherein the surface layer is a direct hybrid bonding layer.

3. The element of claim 1, wherein the first material comprises a dielectric material.

4. The element of claim 3, wherein the dielectric material is selected from the group consisting of: semiconductor oxides, semiconductor nitrides, silicon oxide, silicon nitride, silicon oxynitride, silicon carbonitride, and silicon oxycarbonitride.

5. An apparatus comprising:
   a first substrate;
   a first layer on the first substrate, the first layer comprising:
      at least one first region comprising an optically transparent and electrically insulative first material; and
      at least one second region at least partially embedded in the at least one first region, the at least one second region comprising an optically transparent and electrically conductive second material;
   a second substrate; and
   a second layer on the second substrate, the second layer directly bonded to the first layer, the second layer comprising:
      at least one third region comprising an electrically insulative third material; and
      at least one fourth region at least partially embedded in the at least one third region, the at least one fourth region comprising an electrically conductive fourth material, the at least one second region and the at least one fourth region providing an electrically conductive and optically transparent connection between the first substrate and the second substrate.

6. The apparatus of claim 5, wherein the at least one first region is directly bonded to the at least one third region and the at least one second region is directly bonded to the at least one fourth region.

7. The apparatus of claim 6, wherein the first material is the same as the third material.

8. The apparatus of claim 6, wherein the first material is different from the third material.

9. The apparatus of claim 6, wherein the second material is the same as the fourth material.

10. The apparatus of claim 6, wherein the second material is different from the fourth material.

11. The apparatus of claim 5, wherein the at least one third region and the at least one fourth region are optically transparent.

12. An apparatus comprising:

a first substrate;

a first plurality of layers on the first substrate, the first plurality of layers comprising:

at least one first layer comprising an optically transparent and electrically conductive first material; and at least one second layer over the at least one first layer, the at least one second layer comprising an optically transparent and electrically conductive second material comprising metal or polysilicon;

a second substrate; and a second plurality of layers on the second substrate, the second plurality of layers comprising:

at least one third layer comprising an optically transparent and electrically conductive third material; and at least one fourth layer over the at least one third layer, the at least one fourth layer comprising an optically transparent and electrically conductive fourth material comprising metal or polysilicon, the fourth material directly bonded to the second material.

13. The apparatus of claim 12, wherein the first material is the same as the third material.

14. The apparatus of claim 12, wherein the first material is different from the third material.

15. The apparatus of claim 12, wherein the second material is the same as the fourth material.

16. The apparatus of claim 12, wherein the second material is different from the fourth material.

17. The apparatus of claim 12, wherein the at least one second layer has a thickness of less than 50 nanometers and the at least one fourth layer has a thickness of less than 50 nanometers.

* * * * *